(12) United States Patent
Lin et al.

(10) Patent No.: US 12,148,681 B2
(45) Date of Patent: Nov. 19, 2024

(54) FAN-OUT PACKAGE STRUCTURE AND METHOD FOR MANUFACTURING THE SAME

(71) Applicant: JCET GROUP CO., LTD., Wuxi (CN)

(72) Inventors: Yaojian Lin, Wuxi (CN); Jian Zuo, Wuxi (CN); Danfeng Yang, Wuxi (CN); Yinghua Gao, Wuxi (CN); Shuo Liu, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 399 days.

(21) Appl. No.: 17/531,739

(22) Filed: Nov. 20, 2021

(65) Prior Publication Data

US 2023/0005811 A1 Jan. 5, 2023

(30) Foreign Application Priority Data

Jun. 30, 2021 (CN) .......................... 202110738098.0

(51) Int. Cl.
*H01L 23/367* (2006.01)
*H01L 21/48* (2006.01)
*H01L 21/56* (2006.01)
*H01L 23/31* (2006.01)
*H01L 23/48* (2006.01)
(Continued)

(52) U.S. Cl.
CPC ...... *H01L 23/3675* (2013.01); *H01L 21/4857* (2013.01); *H01L 21/486* (2013.01); *H01L 21/56* (2013.01); *H01L 23/3128* (2013.01); *H01L 23/481* (2013.01); *H01L 23/49822* (2013.01); *H01L 23/49838* (2013.01); *H01L 23/49816* (2013.01); *H01L 25/0655* (2013.01)

(58) Field of Classification Search
CPC ..... H01L 25/165; H01L 23/3121–3128; H01L 23/142; H01L 23/36–3738; H01L 23/4334; H01L 23/5381; H01L 23/5383; H01L 23/5386; H01L 24/18–25; H01L 24/82; H01L 23/10; H01L 23/28–3128; H01L 23/367; H01L 24/24
See application file for complete search history.

(56) References Cited

U.S. PATENT DOCUMENTS

2018/0151502 A1* 5/2018 Lin ..................... H01L 23/5389
2019/0096825 A1* 3/2019 Kim ........................ H01L 23/16
2019/0103425 A1* 4/2019 Yoon ................. H01L 27/14634
(Continued)

*Primary Examiner* — Evan G Clinton
(74) *Attorney, Agent, or Firm* — MUNCY, GEISSLER, OLDS & LOWE, P.C.

(57) ABSTRACT

The present invention provides a fan-out package structure and a method for manufacturing the same. The fan-out package structure includes at least one chip and at least one redistribution layer on a functional surface side of the chip, and the redistribution layer includes a dielectric layer and a metal wiring layer distributed within the dielectric layer. The fan-out package structure further includes at least one dummy wafer on the redistribution layer, and the dummy wafer is insulated from the chip and in contact with the metal wiring layer. By providing the dummy wafer on the redistribution layer and configuring the dummy wafer to connect to the metal wiring layer, the dummy wafer can not only function to support the structure and suppress the warpage, but also form a continuous heat dissipation channel, thereby improving thermal management capability of the fan-out package structure.

19 Claims, 4 Drawing Sheets

(51) Int. Cl.
*H01L 23/498* (2006.01)
*H01L 25/065* (2023.01)

(56) References Cited

U.S. PATENT DOCUMENTS

2020/0365525 A1* 11/2020 Wu ........................ H01L 21/486
2022/0359326 A1* 11/2022 Yu ........................ H01L 23/5226

* cited by examiner

FAN-OUT PACKAGE STRUCTURE AND METHOD FOR MANUFACTURING THE SAME

TECHNICAL FIELD

The present invention relates to the field of packaging technologies, and in particular to a fan-out package structure and a method for manufacturing the same.

BACKGROUND

Fan-out packages generally have a large aspect ratio of chips, a rather thick stack structure of redistribution layers, and few options for plastic package materials, which cause the fan-out package structure to have a poor thermal management capability. In order to enhance the heat dissipation, the plastic package layer is thinned to expose a non-functional surface of the chip. However, under a combined effect of the aforesaid structural features, the difference in thermal expansion between different materials may further cause warpage in the fan-out package structure.

SUMMARY

An object of the present invention is to provide a fan-out package structure and a method for manufacturing the same.

The present invention provides a fan-out package structure. The fan-out package structure includes at least one chip and at least one redistribution layer on a functional surface side of the chip, and the redistribution layer includes a dielectric layer and a metal wiring layer distributed within the dielectric layer. The fan-out package structure further includes at least one dummy wafer on the redistribution layer, and the dummy wafer is insulated from the chip and in contact with the metal wiring layer.

As a further improvement of the present invention, at least one first through hole disposed below the dummy wafer is provided in a first dielectric layer adjacent to the dummy wafer, and a first metal wiring layer distributed in the first dielectric layer is connected to the dummy wafer via the first through hole.

As a further improvement of the present invention, the dummy wafer includes an insulation layer on a lower surface of the dummy wafer, and the first metal wiring layer is connected to the insulation layer.

As a further improvement of the present invention, the functional surface of the chip includes a plurality of pads and an insulation region distributed between the pads, and the pads are electrically connected to the first metal wiring layer. At least one second through hole disposed below the insulation region is provided in the first dielectric layer, and the metal wiring layer is connected to the insulation region via the second through hole.

As a further improvement of the present invention, a plastic package layer is further included and covers the chip and the dummy wafer, wherein at least one third through hole disposed below a region of the plastic package layer is provided in the first dielectric layer, and the metal wiring layer is connected to the plastic package layer via the third through hole.

As a further improvement of the present invention, the plastic package layer at least completely covers an upper surface of the dummy wafer.

As a further improvement of the present invention, a heat dissipation layer is provided on an upper surface of the dummy wafer, and the plastic package layer at least covers a side surface of the heat dissipation layer.

As a further improvement of the present invention, a cavity recessed inwardly is provided on an upper surface of the dummy wafer, and the plastic package layer is at least filled in the cavity.

As a further improvement of the present invention, a heat dissipation layer is provided on a surface of the cavity.

As a further improvement of the present invention, the heat dissipation layer is at least thicker than the metal wiring layer.

As a further improvement of the present invention, the dummy wafer and the chip form an equivalent aspect, and the equivalent aspect forms an effective relative aspect ratio ranging from 0.5 to 1.5 to an aspect of the fan-out package structure, or a ratio of an area of the plastic package layer in a direction X on side surfaces of the chip and the dummy wafer to an area of the plastic package layer in a direction Y ranges from 0.5 to 1.5.

The present invention further provides a method for manufacturing a fan-out package structure, including:

providing a chip and a dummy wafer, and forming a plastic package layer by plastic-packaging the chip and the dummy wafer and exposing a functional surface of the chip and a lower surface of the dummy wafer;

forming a redistribution layer including a dielectric layer and a metal wiring layer on the functional surface side of the chip and the lower surface side of the dummy wafer, and configuring the metal wiring layer to be in direct contact with the dummy wafer; and acquiring a singulated fan-out package structure by cutting.

As a further improvement of the present invention, configuring the metal wiring layer to be in direct contact with the dummy wafer specifically includes:

forming a first metal wiring layer and a first dielectric layer 21a on the functional surface side of the chip and the lower surface side of the dummy wafer, opening at least one first through hole in the first dielectric layer 21a, and connecting the first metal wiring layer to the dummy wafer via the first through hole, wherein the first through hole is disposed below the dummy wafer.

As a further improvement of the present invention, prior to forming the plastic package layer, the method further includes:

providing an insulation layer on the lower surface of the dummy wafer.

As a further improvement of the present invention, the method further includes:

opening at least one second through hole in the first dielectric layer, and connecting the first metal wiring layer to the insulation region via the second through hole, wherein the second through hole is disposed below an insulation region of the functional surface of the chip.

As a further improvement of the present invention, the method further includes:

opening at least one third through hole in the first dielectric layer, and connecting the first metal wiring layer to the plastic package layer via the third through hole, wherein the third through hole is disposed below a region of the plastic package layer.

As a further improvement of the present invention, the plastic package layer at least completely covers an upper surface of the dummy wafer.

As a further improvement of the present invention, prior to forming the plastic package layer, the method further includes:

providing a heat dissipation layer on an upper surface of the dummy wafer.

As a further improvement of the present invention, prior to forming the plastic package layer, the method further includes:

forming a cavity recessed inwardly on an upper surface of the dummy wafer; and providing a heat dissipation layer on an inner surface of the cavity.

As a further improvement of the present invention, the heat dissipation layer is at least thicker than the metal wiring layer.

As a further improvement of the present invention, the dummy wafer and the chip form an equivalent aspect, the equivalent aspect forms an effective relative aspect ratio ranging from 0.5 to 1.5 to an aspect of the fan-out package structure, or a ratio of an area of the plastic package layer in a direction X on side surfaces of the chip and the dummy wafer to an area of the plastic package layer in a direction Y ranges from 0.5 to 1.5.

The present invention has following beneficial effects. By providing the dummy wafer on the redistribution layer and configuring the dummy wafer to connect to the metal wiring layer disposed within the first redistribution layer adjacent to the dummy wafer, the dummy wafer can not only function to support the structure and suppress the warpage, but also form a continuous heat dissipation channel, thereby improving the thermal management capability of the fan-out package structure.

DETAILED DESCRIPTION

In order to make the purpose, technical solutions, and advantages of the present application clearer, the technical solutions of the present application will be clearly and completely described below in conjunction with the specific embodiments of the present application and the corresponding drawings. Obviously, the described embodiments are only a part of the embodiments of the present application, rather than all of the embodiments. Based on the embodiments in present application, all other embodiments obtained by those of ordinary skill in the art without creative work shall fall within the protection scope of the present invention.

The following describes the embodiments of the present invention in detail. Examples of the embodiments are shown in the accompanying drawings, in which the same or similar reference numerals indicate the same or similar elements or elements with the same or similar functions through the whole text. The following embodiments described with reference to the accompanying drawings are exemplary, and are only used to explain the present invention, but should not be understood as limiting the same.

For the convenience of description, this application uses terms representing the relative positions in space for description, such as "upper", "lower", "rear", "front", etc., which are used to describe the relationship of one unit or feature shown in the drawings relative to another unit or feature. The terms describing the relative positions in space may include different orientations of the equipment in use or operation other than the orientations shown in the drawings. For example, if a device in the drawings is turned over, the unit described as being "below" or "above" other units or features will be positioned "above" or "below" the other units or features. Therefore, the exemplary term "below" can encompass both spatial orientations of below and above.

Figure 1:
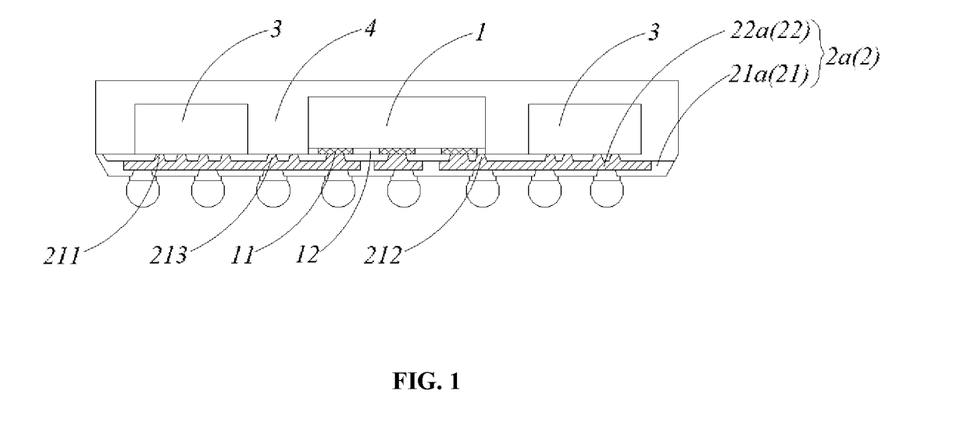
FIG. 1 is a schematic diagram of a fan-out package structure according to Embodiment 1 of the present invention.

As shown in FIG. 1, the present invention provides a fan-out package structure including a chip 1 and at least one redistribution layer 2 on a functional surface of the chip 1. The redistribution layer 2 includes a dielectric layer 21 and a metal wiring layer 22 distributed within the dielectric layer 21.

Exemplarily, as shown in FIG. 1, a first redistribution layer 2a is provided in Embodiment 1. The first redistribution layer 2a includes a first dielectric layer 21a and a first metal wiring layer 22a within the first dielectric layer 21a. In other embodiments, a plurality of redistribution layers 2 may be provided according to the needs in circuit layout of the chip 1.

Further, the fan-out package structure further includes at least one dummy wafer 3 on the redistribution layer 2. The dummy wafer 3 is a silicon wafer or the like provided in the package structure, and merely functions to support the structure, enhance the heat dissipation and the like. The dummy wafer 3 may further participate in the layout of conductive circuits, and for example, a metal grounding layer may be provided on the lower surface of the dummy wafer 3. The dummy wafer 3 is insulated from the chip 1, and the metal wiring layer 22 is in contact with the dummy wafer 3.

Specifically, at least one first through hole 211 is provided in the first dielectric layer 21a adjacent to the dummy wafer 3. The first through hole 211 is disposed below the dummy wafer 3, and the metal wiring layer 22 distributed in the first dielectric layer 21a is connected to the dummy wafer 3 via the first through hole 211. By providing the dummy wafer 3 on the redistribution layer 2, the dummy wafer 3 having a relatively high structural strength may be employed to fill a blank area above the redistribution layer 2 to restrict the warpage of the package structure. In addition, the metal wiring layer 22 is directly connected to the dummy wafer 3, such that a continuous heat dissipation channel from the chip 1 to the dummy wafer 3 through the metal wiring layer 22 is formed, thereby improving the heat dissipation capability of the package structure and facilitating design of the thermal management for the package structure.

The grounding circuit portion of the first metal wiring layer 22a may be connected to the dummy wafer 3, or the dummy wafer 3 further includes an insulation layer on the lower surface of the dummy wafer 3. The first metal wiring layer 22a is connected to the insulation layer to prevent the dummy wafer 3 from forming an electrical connection with other portions and thereby from causing a short circuit.

Still further, the functional surface of the chip 1 includes a plurality of pads 11 and an insulation region 12 distributed between the pads 11. At least one second through hole 212 is provided in the first dielectric layer 21a and disposed below the insulation region 12, and the metal wiring layer 22 is connected to the insulation region 12 via the second through hole 212. By connecting the metal wiring layer 22 to the insulation region 12 of the functional surface of chip 1, the chip 1 is further added with a channel for transferring heat outwards, thereby facilitating heat dissipation of the chip 1.

Still further, the fan-out package structure further includes a plastic package layer 4, which is provided on the redistribution layer 2 and covers the chip 1 and the dummy wafer 3. At least one third through hole 213 is provided in the first dielectric layer 21a and disposed below the region of the plastic package layer 4, and the metal wiring layer 22 is connected to the plastic package layer 4 via the third through hole 213. As a result, the metal wiring layer 22 is connected to the plastic package layer 4 based on the first through hole 211 and the second through hole 212, such that a heat dissipation channel for connecting the metal wiring layer 22 to the plastic package layer 4 is formed, thereby further improving the heat dissipation capability of the package structure.

The material of the plastic package layer 4 may be for example an organic polymer resin with an inorganic filler, or an organic polymer resin with glass fiber cloth and a filler, or a polymer composite with a filler, such as epoxy resin, polyimide (PI), or dry film.

The specific numbers and distribution positions of the first through hole 211, the second through hole 212 and the third through hole 213 may be adjusted specifically based on actual sizes of the chip and dummy wafer and the wiring circuit, which is not specifically limited in the present invention.

In summary, a three-dimensional continuous heat dissipation channel can be formed in the package structure by the first through hole 211, the second through hole 212, the third through hole 213, and the metal wiring layer 22 therein, which can significantly improve the heat dissipation capability of the package structure.

When there are a plurality of redistribution layers 2, the first dielectric layer 21a adjacent to the dummy wafer 3 is provided with the through hole, whereas the remaining dielectric layer 21 and metal wiring layer 22 are provided in accordance with the conventional wiring fashion as long as a continuous heat dissipation channel connected to the dummy wafer 3 is formed. Alternatively, through holes connected to the first through hole 211, the second through hole 212 and the third through hole 213 may be provided within the remaining dielectric layer 21 and connected by the metal wiring layer 22, thereby further improving the heat dissipation capability.

As shown in FIG. 1, in Embodiment 1, the plastic package layer 4 completely covers at least the upper surface of the dummy wafer 3. The upper surface of the dummy wafer 3 is completely covered, and a part of the plastic package layer 4 is left above the dummy wafer 3 to avoid the exposure of the dummy wafer 3, such that the plastic package layer 4 herein matches the warpage of the redistribution layer 2 and thereby functions to adjust the warpage by well corresponding to the redistribution layer 2.

Figure 2:
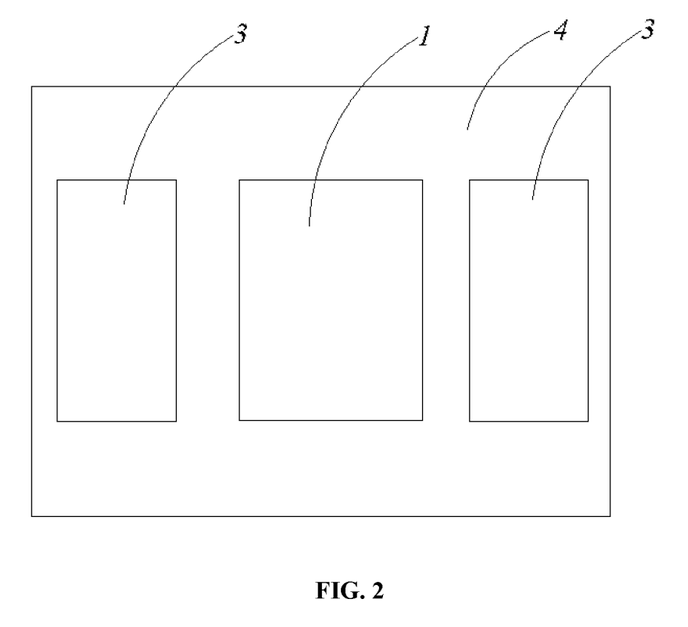
FIG. 2 is a top view of the fan-out package structure according to Embodiment 1 of the present invention.

As shown in FIGS. 1 and 2, in Embodiment 1, the number of dummy wafers 3 is two, and they are provided on two sides of the chip 1 respectively. By providing the dummy wafers 3 evenly on the periphery of the chip 1, the dummy wafer 3 can adjust the warpage of the package structure in a rather balancing fashion, and by controlling the number of dummy wafers 3 to be two, the oversize of the package structure as caused by too many additional dummy wafers 3 can be prevented.

Further, the dummy wafer 3 and the chip 1 form an equivalent aspect, i.e., the aspect of the chip 1 and the dummy wafer 3 when viewed as a whole, in the planar direction. The equivalent aspect forms an effective relative aspect ratio ranging from 0.5 to 1.5, preferably from 0.8 to 1.2, to the aspect of the fan-out package structure. Alternatively, the ratio of the area of the plastic package layer 4 on the side surfaces of the chip 1 and dummy wafer 3 in the direction X to the area of the plastic package layer 4 in the direction Y ranges from 0.5 to 1.5, preferably from 0.8 to 1.2.

By limiting the aspect ratio of the chip 1 and dummy wafer 3 as well as the aspect ratio of the overall package structure, the fan-out package structure can be prevented from forming a too large or too small aspect ratio and causing severe warpage. In addition, the warpage of chip 1 and dummy wafer 3 can be controlled separately to control the warpage of the overall package structure. Meanwhile, by limiting the size, the warpage adjusting effect of the dummy wafer 3 can be balanced with the heat dissipation effect, such that the possible warpage problem of the package structure can be minimized while ensuring the package structure to have an excellent heat dissipation capability.

In other embodiments of the present invention, the number of dummy wafers 3 and the distribution relationship between the dummy wafer 3 and the chip 1 may also be adjusted according to the needs in chip design and circuit layout. For example, the distribution order may be a dummy wafer 3 and a chip 1, or a dummy wafer 3, a dummy wafer 3, and a chip 1. In some cases with low requirements for the size of the package structure, it is also possible to provide a plurality of dummy wafers 3 evenly distributed on the periphery of the chip 1, for example, one dummy wafer 3 is distributed on each of four edges of the chip 1, to fully play the role of the dummy wafer 3 in structural stabilization and heat dissipation.

Figure 3:
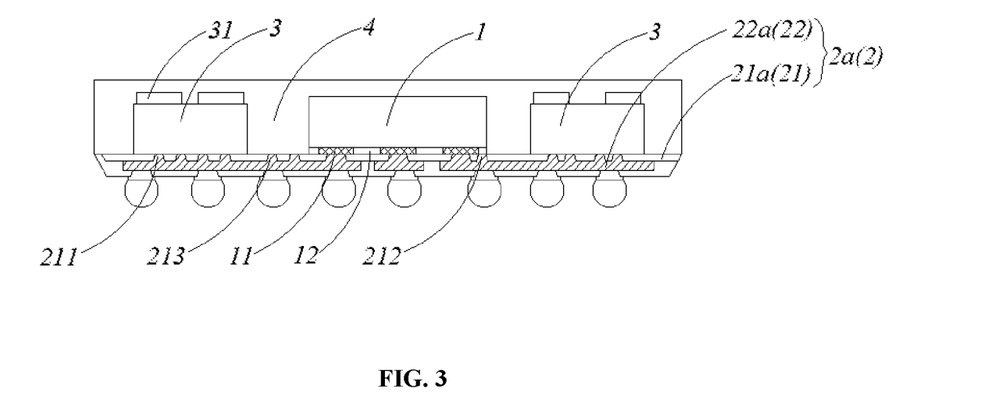
FIG. 3 is a schematic diagram of a fan-out package structure according to Embodiment 2 of the present invention.

As shown in FIG. 3, Embodiment 2 differs from Embodiment 1 in that a heat dissipation layer 31 is provided on the upper surface of the dummy wafer 3, and the plastic package layer 4 covers the heat dissipation layer 31, such that the heat dissipation capability of the dummy wafer 3 can be further improved by providing the heat dissipation layer on the upper surface of the dummy wafer 3.

Preferably, the heat dissipation layer 31 is made of a metal material with excellent heat dissipation performance such as copper, and its plane shape may be configured to be a variety of structures according to needs.

Figure 4:
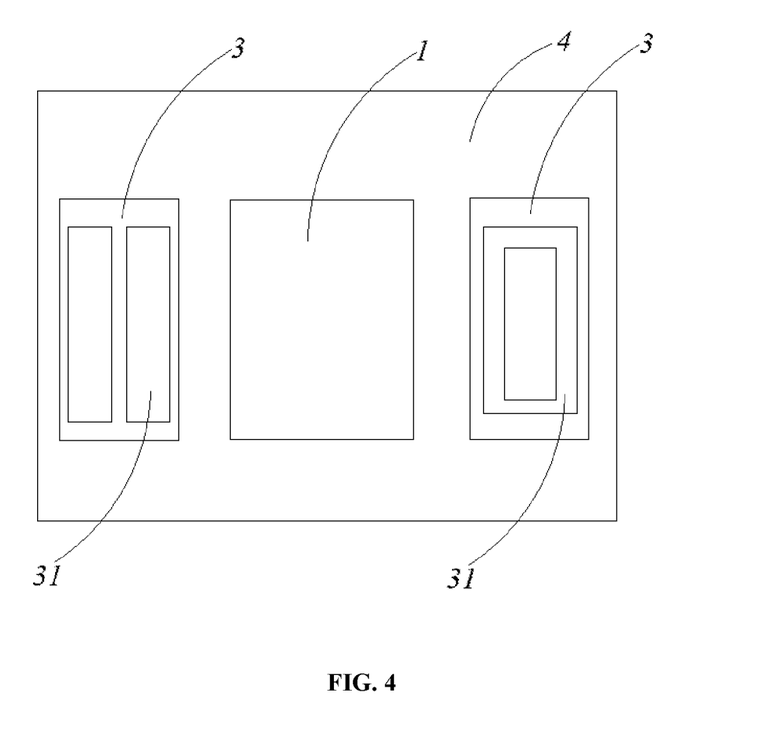
FIG. 4 is a top view of the fan-out package structure according to Embodiment 2 of the present invention.

Exemplarily, as shown in FIGS. 3 and 4, in Embodiment 2, two metal heat dissipation sheets disposed side by side are disposed on the dummy wafer 3 on the left side of the chip 1, and a metal heat dissipation sheet shaped as a rectangular frame is disposed on the dummy wafer 3 on the right side of the chip 1.

Preferably, the heat dissipation layer 31 is at least thicker than the metal wiring layer 22 to match the warpage of the redistribution layer, thereby functioning to suppress the warpage.

Figure 5:
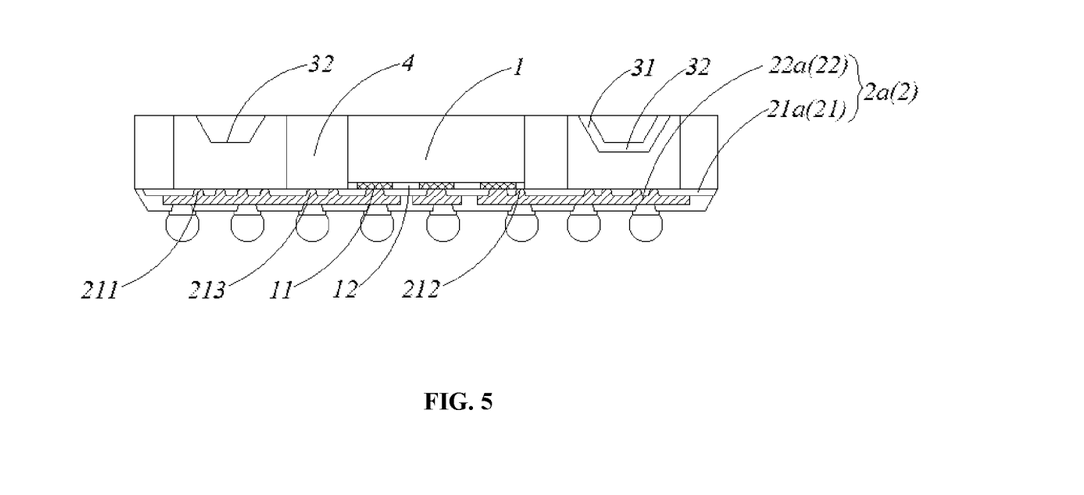
FIG. 5 is a schematic diagram of a fan-out package structure according to Embodiment 3 of the present invention.
Figure 6:
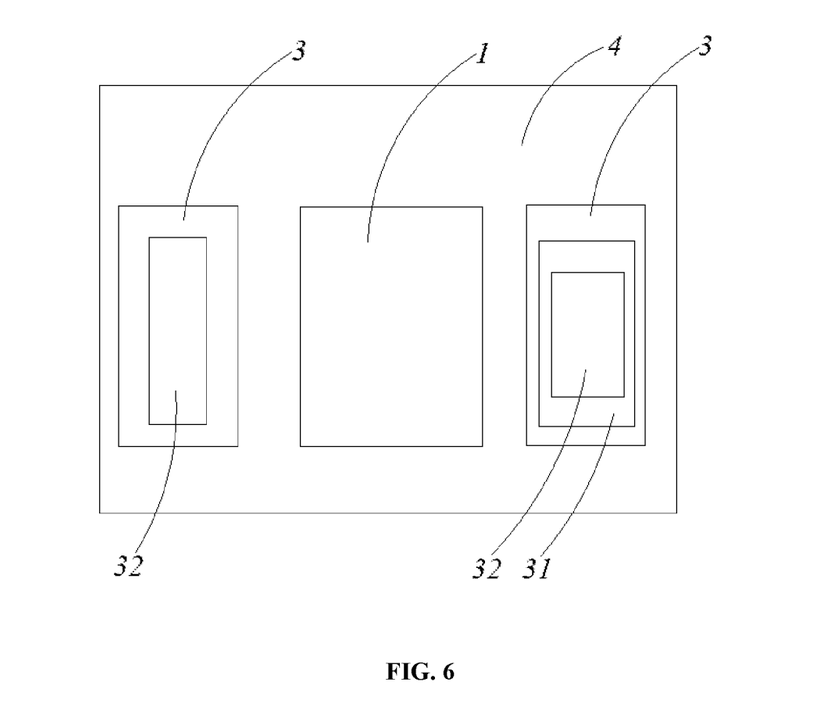
FIG. 6 is a top view of the fan-out package structure according to Embodiment 3 of the present invention.

As shown in FIGS. 5 and 6, Embodiment 3 differs from Embodiment 1 in that a cavity 32 recessed inwardly is provided in the upper surface of the dummy wafer 3, and the plastic package layer 4 is filled in the cavity 32. By providing a recess in the dummy wafer 3 and filling the recess with plastic package material, it is not necessary to configure the plastic package layer 4 to completely cover the upper surface of the dummy wafer 3, and the plastic package material in the recess plays a role in balancing the warpage by corresponding to the redistribution layer 2.

Further, a heat dissipation layer 31 is further provided on the surface of the cavity 32 to further enhance the heat dissipation capability of the dummy wafer 3.

Figure 7:
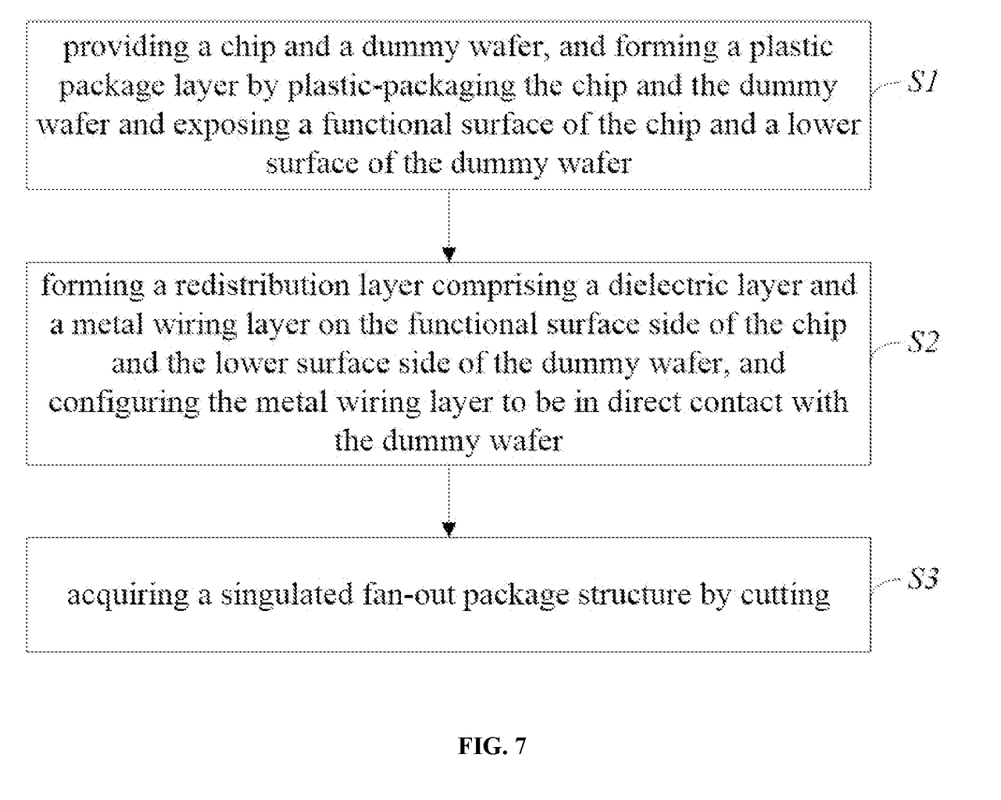
FIG. 7 is a schematic flowchart of a method for manufacturing a fan-out package structure according to an embodiment of the present invention.

As shown in FIG. 7, the present invention further provides a method for manufacturing a fan-out package structure. The method includes the following steps.

In step S1, a chip 1 and a dummy wafer 3 are provided, and a plastic package layer 4 is formed by plastic-packaging the chip 1 and the dummy wafer 3 and exposing a functional surface of the chip 1 and a lower surface of the dummy wafer 3.

Exemplarily, the chip 1 and the dummy wafer 3 may be provided on a temporary carrier firstly, and the chip 1 and the dummy wafer 3 are plastic-packaged before peeling off the temporary carrier.

One dummy wafer 3 may be provided on each of the two sides of the chip 1, or one dummy wafer 3 with a relatively great surface area may be provided between two adjacent chips 1 and then cut into two dummy wafers 3 in the subsequent cutting process, such that the complexity in providing the dummy wafer 3 can be reduced, and the production efficiency can be improved.

Further, the dummy wafer 3 and the chip 1 form an equivalent aspect, i.e., the aspect of the chip 1 and the dummy wafer 3 when viewed as a whole, in the planar direction. The equivalent aspect forms an effective relative aspect ratio ranging from 0.5 to 1.5, preferably from 0.8 to 1.2, to the aspect of the fan-out package structure.

Further, step S1 further includes: providing an insulation layer on the lower surface of the dummy wafer 3.

In some embodiments of the present invention, a cavity 32 may be provided in the upper surface of the dummy wafer 3, and the plastic package material may be filled in the cavity 32. When no cavity 32 is provided in the upper surface of the dummy wafer 3, the plastic package layer 4 is configured to completely cover at least the upper surface of the dummy wafer 3. For example, the dummy wafer 3 may be configured to have a thinner thickness than the chip 1, or the amount of thinning to the plastic package layer 4 may be controlled.

Further, a heat dissipation layer 31 may be provided on the upper surface of the dummy wafer 3 or the surface of the cavity 32 of the dummy wafer, and the heat dissipation layer 31 may be configured to be thicker than at least the metal wiring layer 22.

In step S2, a redistribution layer 2 including a dielectric layer 21 and a metal wiring layer 22 is formed on the functional surface side of the chip 1 and the lower surface side of the dummy wafer 3, and the metal wiring layer 22 is configured to be in direct contact with the dummy wafer 3.

Specifically, a first metal wiring layer 22a and a first dielectric layer 21a are formed on the functional surface side of the chip 1 and the lower surface side of the dummy wafer 3. At least one first through hole 211 disposed below the dummy wafer 3 is opened in the first dielectric layer 21a, and the first metal wiring layer 22a is connected to the dummy wafer 3 via the first through hole 211.

Further, in some embodiments of the present invention, at least one second through hole 212 disposed below an insulation region 12 of the functional surface of the chip 1 may be opened in the first dielectric layer 21a, and the first metal wiring layer 22a is connected to the dummy wafer 3 via the second through hole 212.

Still further, in some embodiments of the present invention, at least one third through hole 213 disposed below the region of the plastic package layer 4 may be opened on the first dielectric layer 21a, and the first metal wiring layer 22a is connected to the plastic package layer 4 via the third through hole 213.

In step S3, a singulated fan-out package structure is acquired by cutting.

Further, for the singulated fan-out package structure as cut, the ratio of the area of the plastic package layer 4 in the direction X on the side surfaces of the chip 1 and the dummy wafer 3 to the area of the plastic package layer 4 in the direction Y is controlled in a range from 0.5 to 1.5, preferably from 0.8 to 1.2.

In summary, in the present invention, by providing the dummy wafer on the redistribution layer and connecting the metal wiring layer within the first redistribution layer adjacent to the dummy wafer to the dummy wafer via the through hole in the dielectric layer, the dummy wafer can not only function to support the structure and suppress the warpage, but also can form a good heat dissipation channel and thereby improve the heat dissipation capability of the fan-out package structure.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments that can be understood by those skilled in the art.

The series of detailed illustration listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A fan-out package structure, comprising: at least one chip and at least one redistribution layer on a functional surface side of the chip, wherein the redistribution layer comprises a dielectric layer and a metal wiring layer distributed within the dielectric layer; and the fan-out package structure further comprises at least one dummy wafer on the redistribution layer, wherein the dummy wafer is insulated from the chip and in contact with the metal wiring layer;

the fan-out package structure further comprises a plastic package layer covering the chip and the dummy wafer, a heat dissipation layer is provided on an upper surface of the dummy wafer, and the plastic package layer at least covers a side surface of the heat dissipation layer.

2. The fan-out package structure according to claim 1, wherein at least one first through hole disposed below the dummy wafer is provided in a first dielectric layer adjacent to the dummy wafer, and a first metal wiring layer distributed in the first dielectric layer is connected to the dummy wafer via the first through hole.

3. The fan-out package structure according to claim 2, wherein the dummy wafer comprises an insulation layer on a lower surface of the dummy wafer, and the first metal wiring layer is connected to the insulation layer.

4. The fan-out package structure according to claim 2, wherein the functional surface of the chip comprises a plurality of pads and an insulation region distributed between the pads, wherein the pads are electrically connected to the first metal wiring layer, at least one second through hole disposed below the insulation region is provided in the first dielectric layer, and the metal wiring layer is connected to the insulation region via the second through hole.

5. The fan-out package structure according to claim 2, wherein at least one third through hole disposed below the plastic package layer is provided in the first dielectric layer, and the metal wiring layer is connected to the plastic package layer via the third through hole.

6. The fan-out package structure according to claim 5, wherein the plastic package layer at least completely covers an upper surface of the dummy wafer.

7. The fan-out package structure according to claim 5, wherein a cavity recessed inwardly is provided on an upper surface of the dummy wafer, and the plastic package layer is at least filled in the cavity.

8. The fan-out package structure according to claim 7, wherein a heat dissipation layer is provided on a surface of the cavity.

9. The fan-out package structure according to claim 1, wherein the heat dissipation layer is at least thicker than the metal wiring layer.

10. The fan-out package structure according to claim 1, wherein the dummy wafer and the chip form an equivalent aspect, and the equivalent aspect forms an effective relative aspect ratio ranging from 0.5 to 1.5 to an aspect of the fan-out package structure, or a ratio of an area of a plastic package layer in a direction X on side surfaces of the chip and the dummy wafer to an area of the plastic package layer in a direction Y ranges from 0.5 to 1.5.

11. A method for manufacturing a fan-out package structure according to claim 1, comprising:
providing the chip and the dummy wafer, and forming a plastic package layer by plastic-packaging the chip and the dummy wafer and exposing the functional surface of the chip and a lower surface of the dummy wafer;
forming the redistribution layer comprising the dielectric layer and the metal wiring layer on the functional surface side of the chip and the lower surface side of the dummy wafer, and configuring the metal wiring layer to be in direct contact with the dummy wafer; and
acquiring a singulated fan-out package structure by cutting.

12. The method for manufacturing the fan-out package structure according to claim 11, wherein configuring the metal wiring layer to be in direct contact with the dummy wafer specifically comprises:
forming a first metal wiring layer and a first dielectric layer on the functional surface side of the chip and the lower surface side of the dummy wafer, opening at least one first through hole in the first dielectric layer, and connecting the first metal wiring layer to the dummy wafer via the first through hole, wherein the first through hole is disposed below the dummy wafer.

13. The method for manufacturing the fan-out package structure according to claim 12, wherein prior to forming the plastic package layer, the method further comprises:
providing an insulation layer on the lower surface of the dummy wafer.

14. The method for manufacturing the fan-out package structure according to claim 12, further comprising:
opening at least one second through hole in the first dielectric layer, and connecting the first metal wiring layer to an insulation region via the second through hole, wherein the second through hole is disposed below the insulation region of the functional surface of the chip.

15. The method for manufacturing the fan-out package structure according to claim 12, further comprising:
opening at least one third through hole in the first dielectric layer, and connecting the first metal wiring layer to the plastic package layer via the third through hole, wherein the third through hole is disposed below the plastic package layer.

16. The method for manufacturing the fan-out package structure according to claim 11, wherein the plastic package layer at least completely covers an upper surface of the dummy wafer.

17. The method for manufacturing the fan-out package structure according to claim 11, wherein prior to forming the plastic package layer, the method further comprises:
providing a heat dissipation layer on an upper surface of the dummy wafer.

18. The method for manufacturing the fan-out package structure according to claim 11, wherein prior to forming the plastic package layer, the method further comprises:
forming a cavity recessed inwardly on an upper surface of the dummy wafer; and
providing a heat dissipation layer on an inner surface of the cavity.

19. The method for manufacturing the fan-out package structure according to claim 11, wherein the dummy wafer and the chip form an equivalent aspect, and the equivalent aspect forms an effective relative aspect ratio ranging from 0.5 to 1.5 to an aspect of the fan-out package structure, or a ratio of an area of the plastic package layer in a direction X on side surfaces of the chip and the dummy wafer to an area of the plastic package layer in a direction Y ranges from 0.5 to 1.5.

* * * * *